(12) United States Patent
Lin et al.

(10) Patent No.: US 10,985,262 B2
(45) Date of Patent: Apr. 20, 2021

(54) SEMICONDUCTOR STRUCTURE AND MANUFACTURING METHOD THEREOF

(71) Applicant: Winbond Electronics Corp., Taichung (TW)

(72) Inventors: Keng-Ping Lin, Taichung (TW); Tzu-Ming Ou Yang, Taichung (TW); Shu-Ming Li, Taichung (TW); Tetsuharu Kurokawa, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/168,847

(22) Filed: Oct. 24, 2018

(65) Prior Publication Data

US 2019/0140069 A1    May 9, 2019

(30) Foreign Application Priority Data

Nov. 7, 2017   (CN) .......................... 201711082329.7

(51) Int. Cl.
| | |
|---|---|
| *H01L 21/762* | (2006.01) |
| *H01L 21/308* | (2006.01) |
| *H01L 21/84* | (2006.01) |
| *H01L 21/8238* | (2006.01) |
| *H01L 21/70* | (2006.01) |
| *H01L 21/8234* | (2006.01) |
| *H01L 29/66* | (2006.01) |
| *H01L 29/51* | (2006.01) |

(Continued)

(52) U.S. Cl.
CPC ...... *H01L 29/6656* (2013.01); *H01L 21/3086* (2013.01); *H01L 21/762* (2013.01); *H01L 27/10* (2013.01); *H01L 29/517* (2013.01); *H01L 29/518* (2013.01); *H01L 29/7851* (2013.01)

(58) Field of Classification Search
CPC ................................................... H01L 21/3086
See application file for complete search history.

(56) References Cited

U.S. PATENT DOCUMENTS 5,543,643 A * 8/1996 Kapoor ............... H01L 21/2815
257/262
5,989,967 A * 11/1999 Gardner ............ H01L 21/28123
257/344

(Continued)

FOREIGN PATENT DOCUMENTS

| CN | 1627503 | 6/2005 |
| TW | 201731101 | 9/2017 |

OTHER PUBLICATIONS

"Office Action of China Counterpart Application", dated Jun. 1, 2020, p. 1-p. 5.

*Primary Examiner* — Omar F Mojaddedi
(74) *Attorney, Agent, or Firm* — JCIPRNET

(57) ABSTRACT

A semiconductor structure and a manufacturing method thereof are provided. The semiconductor structure includes a substrate, a plurality of gate structures, a plurality of dielectric structures, and spacers. The plurality of gate structures is disposed on the substrate. The plurality of dielectric structures is respectively disposed between the gate structures and the substrate, wherein a top width of the dielectric structure is less than the bottom width of the dielectric structure. The spacers are disposed on the sidewalls of the gate structures and cover the sidewalls of the dielectric structures.

16 Claims, 5 Drawing Sheets

(51) Int. Cl.
*H01L 29/78* (2006.01)
*H01L 27/10* (2006.01)

(56) References Cited

U.S. PATENT DOCUMENTS

| | | | | |
|---|---|---|---|---|
| 6,107,171 | A * | 8/2000 | Tsai | H01L 21/28061 |
| | | | | 257/E21.2 |
| 6,472,283 | B1 * | 10/2002 | Ishida | H01L 29/6653 |
| | | | | 438/230 |
| 8,093,146 | B2 | 1/2012 | Wang | |
| 2003/0198104 | A1 * | 10/2003 | Lee | H01L 27/115 |
| | | | | 365/200 |
| 2005/0026380 | A1 * | 2/2005 | Kammler | H01L 29/6656 |
| | | | | 438/305 |
| 2005/0145896 | A1 * | 7/2005 | Song | H01L 29/40117 |
| | | | | 257/288 |
| 2006/0292779 | A1 * | 12/2006 | Chen | H01L 21/26506 |
| | | | | 438/197 |
| 2007/0246751 | A1 * | 10/2007 | Cheng | H01L 29/6656 |
| | | | | 257/288 |
| 2008/0061366 | A1 * | 3/2008 | Liu | H01L 21/823807 |
| | | | | 257/336 |
| 2011/0230029 | A1 * | 9/2011 | Wang | H01L 21/28123 |
| | | | | 438/302 |
| 2013/0273702 | A1 * | 10/2013 | Zheng | H01L 21/823814 |
| | | | | 438/199 |
| 2015/0035069 | A1 * | 2/2015 | Hung | H01L 21/845 |
| | | | | 257/369 |
| 2015/0123205 | A1 | 5/2015 | Basu et al. | |
| 2016/0149017 | A1 * | 5/2016 | Tsai | H01L 21/02252 |
| | | | | 257/288 |

* cited by examiner

SEMICONDUCTOR STRUCTURE AND MANUFACTURING METHOD THEREOF

CROSS-REFERENCE TO RELATED APPLICATION

This application claims the priority benefit of China application serial no. 201711082329.7, filed on Nov. 7, 2017. The entirety of the above-mentioned patent application is hereby incorporated by reference herein and made a part of this specification.

BACKGROUND

Technical Field

The present invention generally relates to a semiconductor structure and a manufacturing method thereof, and particularly to a semiconductor structure having a large pitch between adjacent gate structures and the manufacturing method thereof.

Description of Related Art

Dynamic random access memory is a common volatile memory, which is comprised of multiple memory cells. Each memory cell is mainly comprised of a transistor and a capacitor controlled thereby, and each memory cell is electrically connected to each other by a word line and a bit line.

In general, the capacitor is electrically connected to the source/drain region of the transistor through a contact disposed in an inter-layer dielectric layer. In other words, the contact penetrates through the dielectric layer between adjacent transistors in the memory cell array to connect to the substrate. With the size of the device continues to shrink, the pitch between adjacent transistors also decreases, resulting in the contact failing to effectively connect to the substrate, thereby affecting the performance of the device.

SUMMARY OF THE INVENTION

The present invention provides a semiconductor structure, wherein the adjacent gate structures have a large pitch therebetween.

The present invention provides a manufacturing method of semiconductor structure for manufacturing the semiconductor structure.

The method of manufacturing the semiconductor structure of the present invention includes the following steps. A substrate having a memory region and a peripheral region is provided, wherein the substrate in the memory region has a first dielectric layer thereon and the substrate in the peripheral region has a second dielectric layer thereon. A plurality of first gate structures are formed on the first dielectric layer. At least one second gate structure is formed on the second dielectric layer. A third dielectric layer is formed on the substrate, and the third dielectric layer covers the substrate, the first dielectric layer, the first gate structure, the second dielectric layer and the second gate structure. Portions of first dielectric layer and the third dielectric layer on the substrate on both sides of the first gate structure are removed to form first spacers on the sidewalls of the first gate structures, and form first dielectric structures. The first spacers on the sidewalls of the first gate structures and a portion of the first dielectric structures are removed. A fourth dielectric layer is formed to cover the second gate structure, second dielectric layer, the substrate, the first dielectric structures, and the first gate structures. A portion of the fourth dielectric layer on the substrate in the memory region is removed to form second spacers on the sidewalls of the first gate structures and the sidewalls of the first dielectric structures.

The semiconductor structure of the present invention includes a substrate, a plurality of gate structures, a plurality of dielectric structures, and spacers. The plurality of gate structures are disposed on the substrate. The plurality of dielectric structures are respectively disposed between each of the gate structures and the substrate, wherein a top width of each of the dielectric structures is less than the bottom width of each of the dielectric structures. The spacers are disposed on sidewalls of the gate structures and sidewalls of the dielectric structures.

The method of manufacturing the semiconductor structure of the present invention includes the following steps. A substrate having a first dielectric layer thereon is provided. A plurality of gate structures are formed on the first dielectric layer. A second dielectric layer is formed on the substrate, wherein the second dielectric layer covers the substrate, the first dielectric layer and the plurality of gate structures. Portions of the first dielectric layer and the second dielectric layer on the substrate on both sides of the plurality of gate structures are removed to form first spacers on the sidewalls of the gate structures, and form dielectric structures. The first spacers on the sidewalls of the gate structures and a portion of the dielectric structures are removed. A third dielectric layer is formed to cover the substrate, the first dielectric structures and the plurality of gate structures. A portion of the third dielectric layer on the substrate is removed to form second spacers on the sidewalls of the gate structures and the sidewalls of the dielectric structures.

Based on the above, in the present invention, the size of the dielectric structure located between the gate structure and the substrate is reduced through an etching process, such that the adjacent gate structures have a large pitch therebetween to increase the area of the exposed surface of the substrate, thus facilitating the connection of the contact to the substrate.

To make the foregoing features and advantages of the present invention clearer and more comprehensible, embodiments are described below in detail with reference to the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
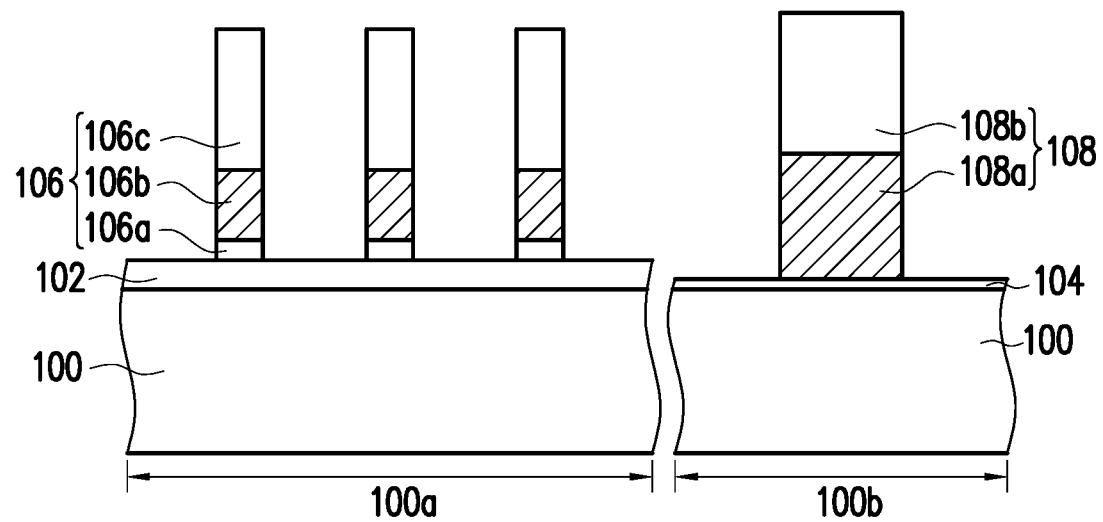
FIG. 1A to FIG. 1J are schematic cross-sectional views illustrating a manufacturing process of a semiconductor structure according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1J are schematic cross-sectional views illustrating a manufacturing process of a semiconductor structure according to an embodiment of the present invention. First, referring to FIG. 1A, a substrate 100 is provided. The substrate 100 has a memory region 100a and a peripheral region 100b. The memory region 100a is the region where a memory cell array is to be formed, and the peripheral region 100b is the region where logic elements are to be formed. An isolation structure (e.g. a shallow trench isolation structure) may be provided in the substrate 100 to define an active area. In this embodiment, the isolation structure in the substrate 100 is omitted for clarity and ease of illustration.

A dielectric layer 102 is formed on the substrate 100 in the memory region 100a, and a dielectric layer 104 is formed on the substrate 100 in the peripheral region 100b. In addition, a plurality of gate structures 106 arranged in an array are formed on the dielectric layer 102, a gate structure 108 is formed on the dielectric layer 104. In this embodiment, three gate structures 106 and one gate structure 108 are illustrated, but the disclosure is not limited thereto. The dielectric layer 104 may be used to form a gate insulating layer of a transistor in the peripheral region 100b. In this embodiment, the gate structure 106 includes a nitride layer 106a, a conductive layer 106b (e.g. a polysilicon layer) and a mask layer 106c (e.g. a nitride layer) sequentially stacked on the dielectric layer 102. The gate structure 108 includes a conductive layer 108a (e.g. a polysilicon layer) and a mask layer 108b (e.g. a nitride layer) sequentially stacked on the dielectric layer 104, but the disclosure is not limited thereto. In some other embodiments, other types of gate structures may be formed depending on actual needs. The manufacturing methods of the dielectric layer 102, the dielectric layer 104, the gate structure 106 and the gate structure 108 are well known to a person skilled in the art, and details are not described herein again.

Figure 1B:
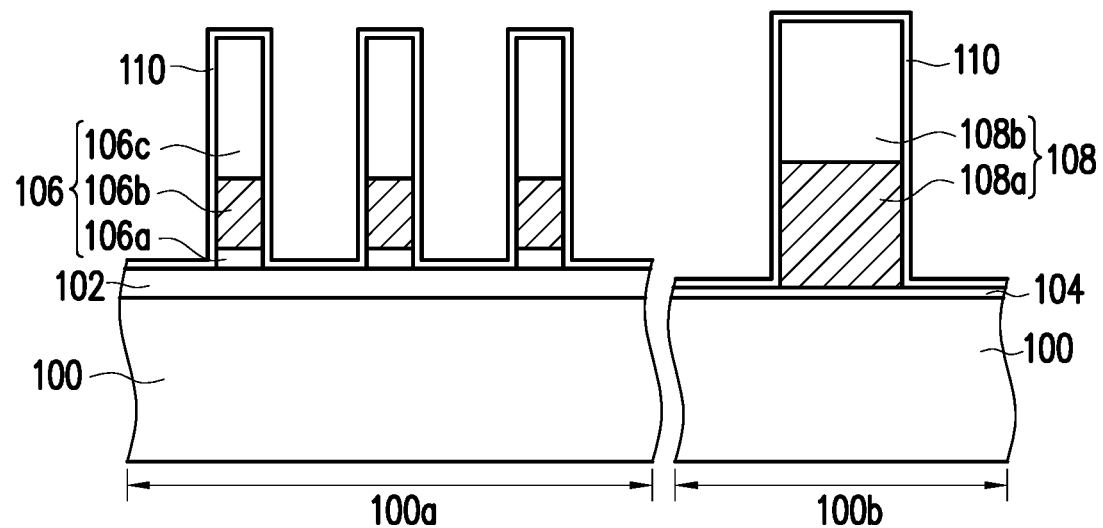

Thereafter, referring to FIG. 1B, a dielectric layer 110 is formed on the substrate 100. The dielectric layer 110 covers the dielectric layer 102, the gate structures 106, the dielectric layer 104 and the gate structure 108. In detail, the dielectric layer 110 is conformally formed on the substrate 100, and may be served as a protective layer of the gate structures 106 in a subsequent etching process. The dielectric layer 110 includes an oxide layer, for example. The forming method of the dielectric layer 110 includes a chemical vapor deposition process, for example. Alternatively, after the etching process for forming the gate structures 106 and the gate structure 108, an oxide layer may be in-situ formed as the dielectric layer 110 without performing a chemical vapor deposition process, so as to simplify the process steps. It is particularly noted that, in this embodiment, the dielectric layer 102, the dielectric layer 104 and the dielectric layer 110 are all oxide layers. However, by adjusting process parameters, the dielectric layer 102 and the dielectric layer 110 may be formed to have the same or similar densities, while the dielectric layer 104 and the dielectric layer 110 have different densities. Thus, the dielectric layer 102 and the dielectric layer 110 may have the same or similar etching rate and may be removed simultaneously in a specific etching process.

Figure 1C:
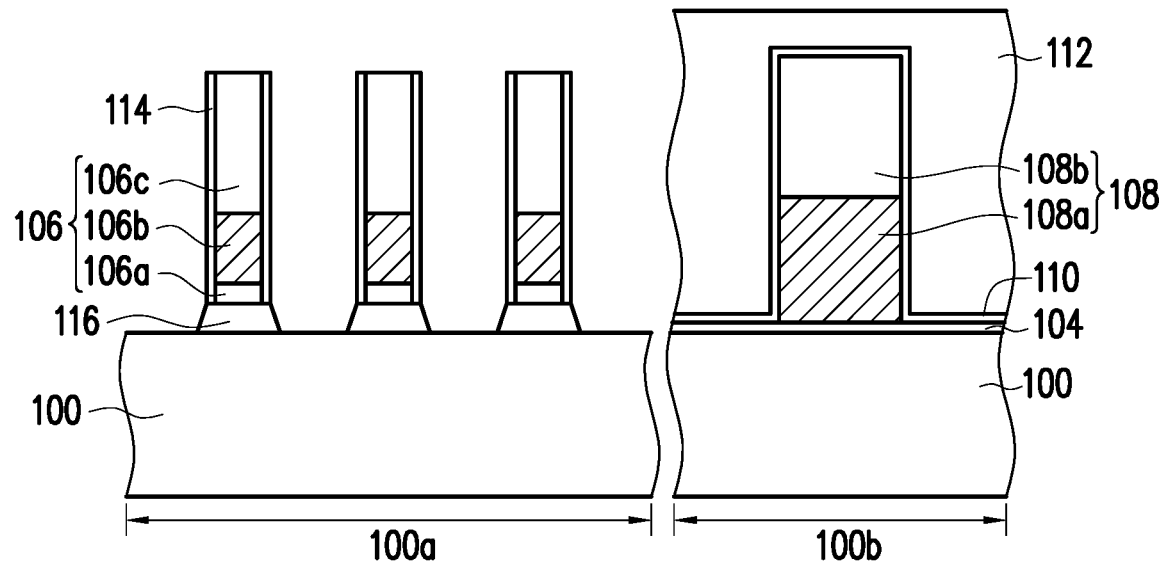

Referring to FIG. 1C, portions of the dielectric layer 102 and the dielectric layer 110 on the substrate 100 on both sides of the gate structures 106 are removed, so as to form spacers 114 on the sidewalls of the gate structures 106, and form dielectric structures 116 between the gate structures 106 and the substrates 100. In detail, firstly, a mask layer 112 is formed on the substrate 100 in the peripheral region 110b. The mask layer 112 is a photoresist layer, for example.

Thereafter, an anisotropic etching process is performed to remove the dielectric layer 102 and the dielectric layer 110 on the substrate 100 on both sides of the gate structures 106 with the mask layer 112 as an etching mask. In this embodiment, since the dielectric layer 102 and the dielectric layer 110 have the same or similar densities, the dielectric layer 102 and the dielectric layer 110 thereon may be removed by a same etching process through adjusting the process parameters of the etching process. However, the disclosure is not limited thereto. In alternative embodiments, the dielectric layer 102 and the dielectric layer 110 on the substrate 100 on both sides of the gate structure 106 may also be removed by different anisotropic etching processes. In addition, the dielectric layer 110 on the top surface of the mask layer 106c is also removed during the etching process, so as to form the spacers 114 on the sidewalls of the gate structures 106.

In addition, due to the high aspect ratio of the space between the adjacent gate structures 106, after the anisotropic etching process is performed, the dielectric structure 116 is formed to have a cross-sectional shape similar to trapezoid, that is, the top width of the dielectric structure 116 may be less than that the bottom width of the dielectric structure 116. However, by forming the dielectric layer 110 with a thickness as thin as possible (e.g. 2 nm to 3 nm), it is still possible to have a large pitch between the bottoms of adjacent gate structures 106, so as to expose more surface of the substrate 100, which is benefit for the connection of a contact formed subsequently to the substrate 100. In addition, the thickness of the dielectric layer 110 is formed to be as thin as possible, therefore, not only the gate structure 106 may be protected from being damaged during the etching process, but also the dielectric layer 110 may be easily removed in a subsequent process.

Figure 1D:
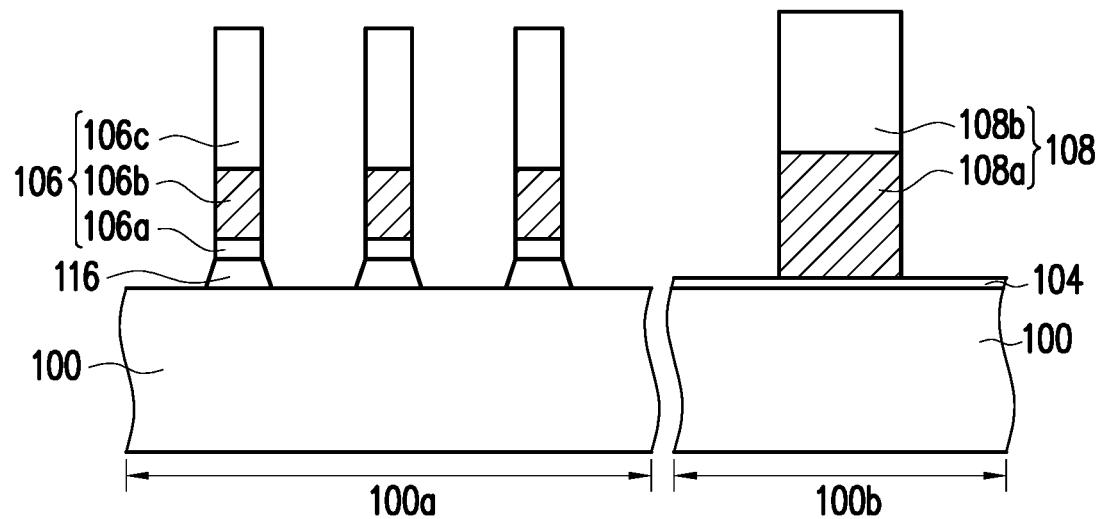

Then, referring to FIG. 1D, the mask layer 112 is removed. Thereafter, the remaining dielectric layer 110 (including the spacer 114) and a portion of the dielectric structure 116 are removed. In detail, after the dielectric structure 116 is formed, the dielectric layer 110 on the entire substrate 100 is removed. The method of removing the dielectric layer 110 includes performing an isotropic etching process. In this way, the dielectric layer 110 in the peripheral region 100b and the spacer 114 (formed by the dielectric layer 110) are both removed. The dielectric layer 104 and the dielectric layer 110 have different etching rates due to different densities. Therefore, the dielectric layer 104 is remained in the peripheral region 100b. In addition, the dielectric layer 102 and the dielectric layer 110 have the same or similar density, therefore, a portion of the dielectric structure 116 is also removed during the etching process. As a result, the size of the dielectric structure 116 is reduced, and the area of the substrate 100 exposed between the bottoms of adjacent gate structures 106 is thus increased, which is benefit for the connection of a contact formed subsequently to the substrate 100.

Figure 1E:
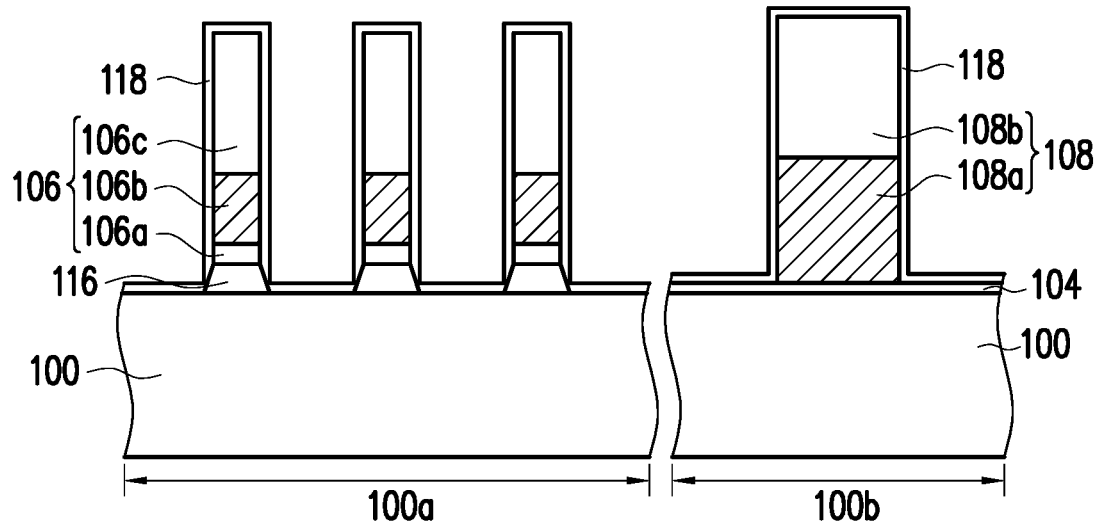

Referring to FIG. 1E, a dielectric layer 118 is conformally formed on the substrate 100. The dielectric layer 118 covers the substrate 100, the gate structure 106, the dielectric structure 116, the dielectric layer 104, and the gate structure 108. The dielectric layer 118 includes a nitride layer, for example. The forming method of the dielectric layer 118 includes a chemical vapor deposition process, for example.

Figure 1F:
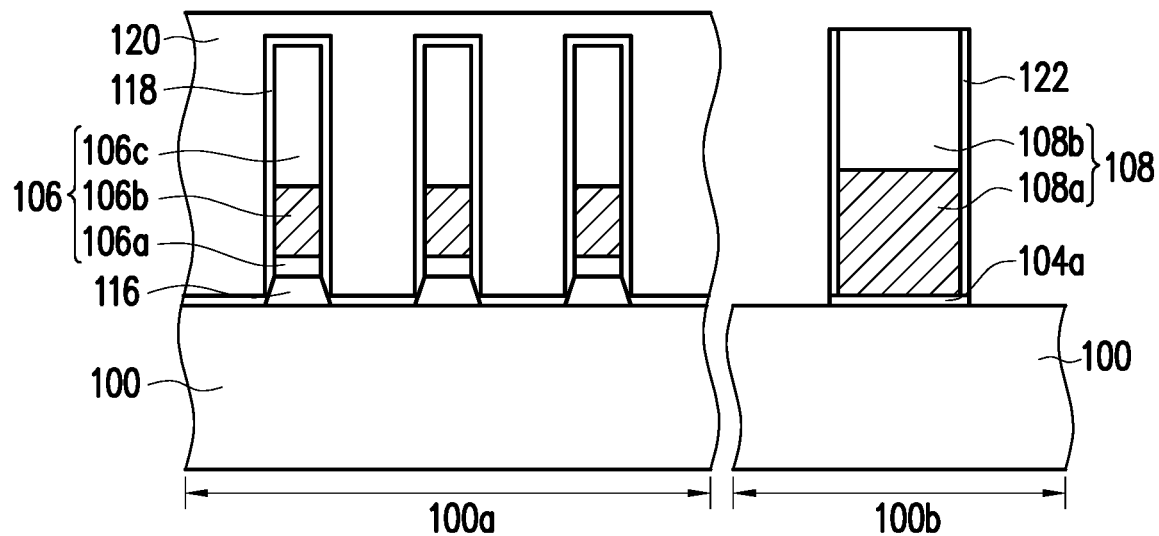

Thereafter, referring to FIG. 1F, a mask layer 120 is formed on the substrate 100 in the memory region 100a. The mask layer 120 is, for example, a photoresist layer. An anisotropic etching process is then performed to remove of the dielectric layer 118 on the substrate 100 in the peripheral region 100b and the underlying dielectric layer 104 with the mask layer 120 as an etching mask, so as to form a spacer 122 on sidewalls of the gate structure 108, and form a gate dielectric layer 104a between the gate structure 108 and the substrate 100. The dielectric layer 118 on the top surface of the gate structure 108 is also removed during the anisotropic etching process.

Figure 1G:
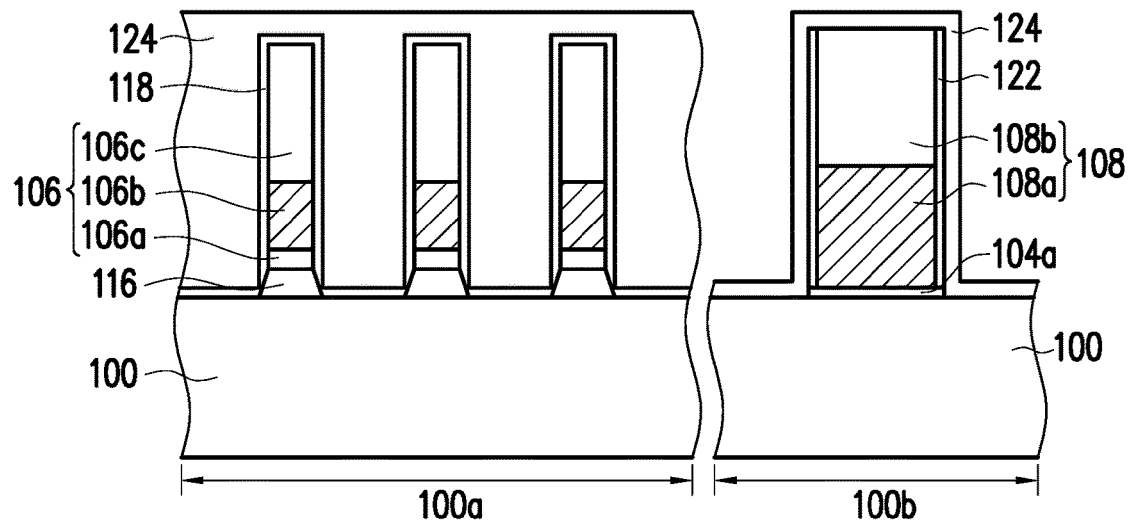

Referring to FIG. 1G, the mask layer 120 is removed. A dielectric material layer 124 is then formed on the substrate 100. The dielectric material layer 124 includes an oxide layer, for example. The forming method of the dielectric material layer 124 includes a chemical vapor deposition process, for example. Since the memory region 100a has the gate structures 106 arranged in an array, and the pitch between the adjacent gate structures 106 is narrow, the dielectric material layer 124 covers the dielectric layer 118 and fills in the space between the gate structures 106. In addition, the pitch between the gate structure 108 and the surrounding components thereof in the peripheral region 100b is greater, therefore, the dielectric material layer 124 is conformally formed on the substrate 100 in the peripheral region 100b.

Figure 1H:
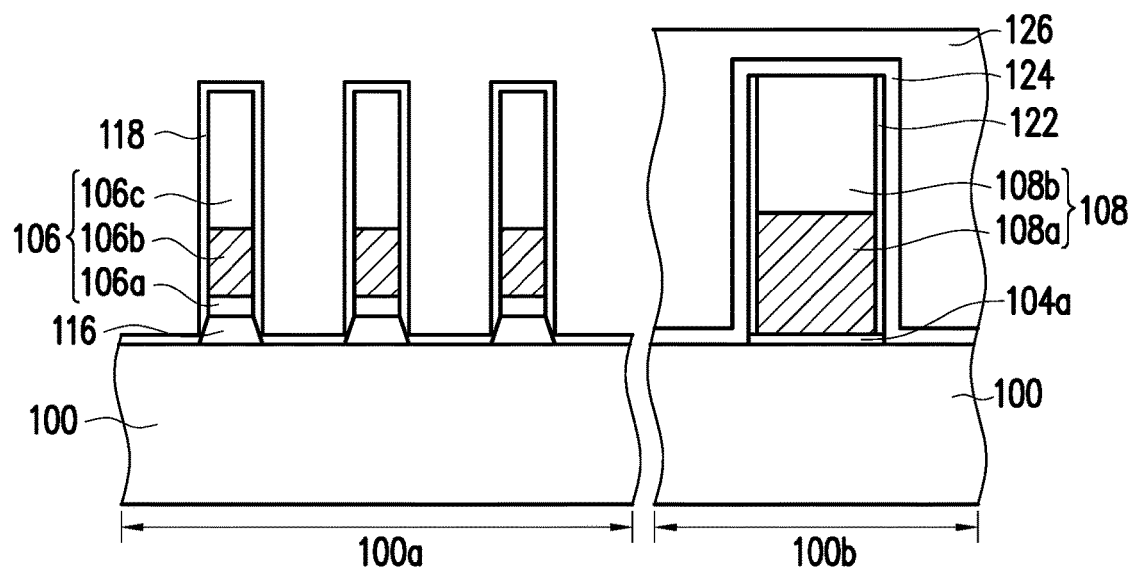

Referring to FIG. 1H, a mask layer 126 is formed on the substrate 100 in the peripheral region 100b. The mask layer 126 is a photoresist layer, for example. An isotropic etching process is then performed to remove the dielectric material layer 124 in the memory region 100a with the mask layer 126 as an etching mask. Since the dielectric layer 118 (nitride layer) has been conformally formed on the substrate 100 in the memory region 100a, the gate structure 106 and the dielectric structure 116 is prevented from being damaged by the isotropic etching process. In addition, since the mask layer 126 is formed on the substrate 100 in the peripheral region 100b, the dielectric material layer 124 in the peripheral region 100b is not affected by the etching process and thus the thickness thereof is not reduced, thereby facilitating the subsequent process.

Figure 1I:
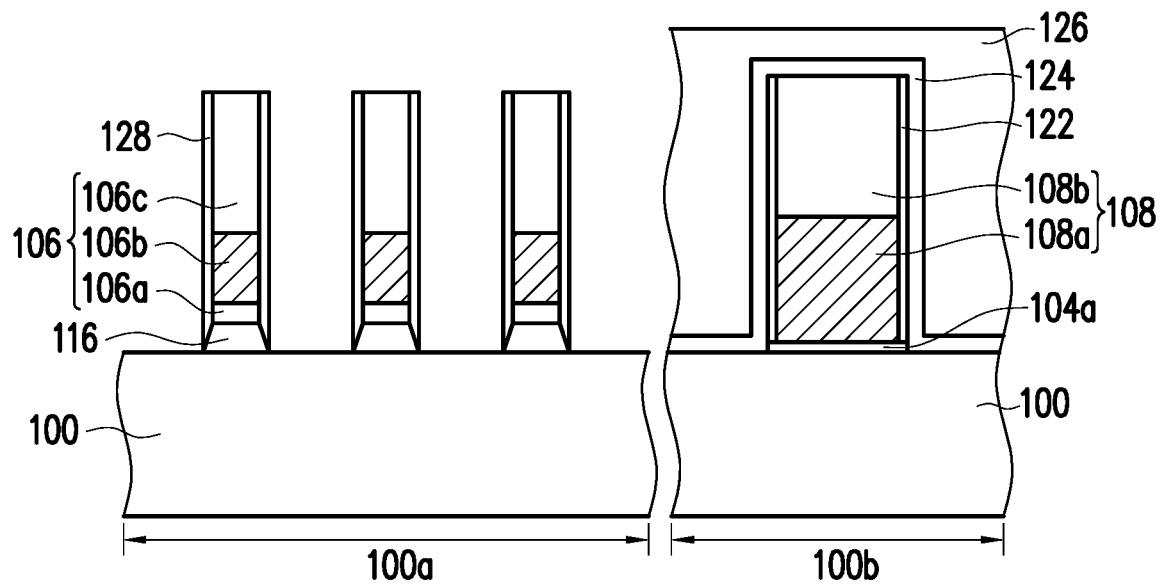
Figure 1J:
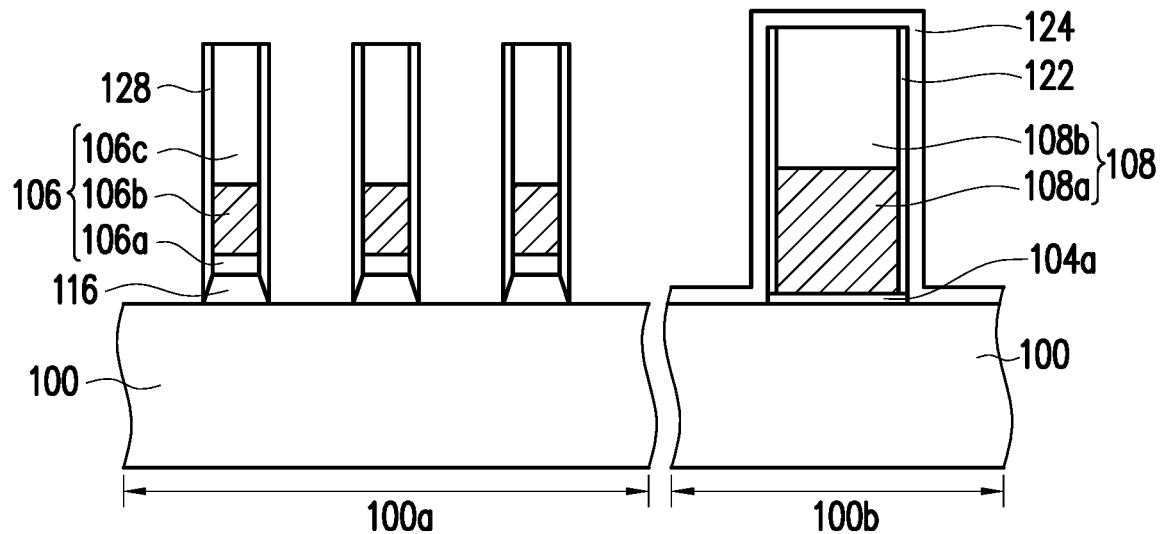

Thereafter, referring to FIG. 1I, an anisotropic etching process is performed to remove a portion of the dielectric layer 118 with the mask layer 126 as an etching mask, so as to expose the surface of the substrate 100, and form spacers 128 on the sidewalls of the gate structures 106 and the sidewalls of the dielectric structures 116. Referring to FIG. 1J, the mask layer 126 is then removed, the manufacture of the semiconductor structure of the present invention is thus completed. Afterwards, processes well known to those skilled in the art, such as forming an interlayer dielectric layer, forming a contact, forming a capacitor, and other steps, may be further performed.

During the manufacturing process of the semiconductor structure of the present invention, the steps of forming the components in the memory region 100a and the peripheral region 100b may be integrated together, and the adjacent gate structures 106 may be formed to expose a larger area of the substrate surface therebetween, thereby facilitating the connection of the contact formed subsequently to the substrate 100. In addition, in the present invention, the spacers 128 cover the sidewalls of the dielectric structures 116, therefore, the dielectric structure 116 may be prevented from being damaged in subsequent processes.

The invention has been described above in the preferred embodiments, but the invention is not limited thereto. It is known to people skilled in the art that some modifications and innovations may be made without departing from the spirit and scope of the invention. Therefore, the scope of the present invention is defined by the following claims.

What is claimed is:

1. A method for manufacturing a semiconductor structure, comprising;
   providing a substrate having a memory region and a peripheral region, wherein the substrate in the memory region has a first dielectric layer thereon, and the substrate in the peripheral region has a second dielectric layer thereon;
   forming a plurality of first gate structures on the first dielectric layer, and at least one second gate structure on the second dielectric layer, wherein the first dielectric layer is between the substrate and the plurality of first gate structures;
   forming a third dielectric layer on the substrate, wherein the third dielectric layer covers the substrate, the first dielectric layer, the plurality of first gate structures, the second dielectric layer and the second gate structure;
   removing portions of the first dielectric layer and simultaneously removing portions of the third dielectric layer on the substrate on both sides of the plurality of first gate structures, so as to form first spacers on the sidewalls of the first gate structures, form dielectric structures and expose the substrate on the both sides of the plurality of first gate structures;
   removing the first spacers on the sidewalls of the first gate structures, and simultaneously removing a portion of the dielectric structures to form first dielectric structures, wherein bottom widths of the first dielectric structures are less than bottom widths of the dielectric structures;
   forming a fourth dielectric layer to cover the second gate structure, the second dielectric layer, the substrate, the first dielectric structures, and the plurality of first gate structures; and
   removing a portion of the fourth dielectric layer on the substrate in the memory region to form second spacers on the sidewalk of the first gate structures and the sidewalk of the first dielectric structures.

2. The method of claim 1, wherein the first dielectric layer, the second dielectric layer and the third dielectric layer respectively comprise an oxide layer.

3. The method of claim 1, wherein the fourth dielectric layer comprises a nitride layer.

4. The method of claim 1, wherein
   after the third dielectric layer is formed, and before the portions of the first dielectric layer and the portions of the third dielectric layer on the substrate in the memory region are simultaneously removed, further comprising forming a mask layer on the substrate in the peripheral region, wherein simultaneously removing the portions of the first dielectric layer and the portions of the third dielectric layer on the substrate in the memory region comprises performing an anisotropic etching process; and
   after the portions of the first dielectric layer and the portions of the third dielectric layer on the substrate in the memory region are simultaneously removed, and before the first spacers and the portion of the dielectric structures are simultaneously removed, further comprising removing the mask layer.

5. The method of claim 1, wherein a method of simultaneously removing the first spacers and the portion of the dielectric structures comprises performing an isotropic etching process.

6. The method of claim 1, further comprising:
   forming a mask layer on the substrate in the memory region after forming the fourth dielectric layer and before forming the second spacers;

performing an anisotropic etching process to remove the fourth dielectric layer on the substrate in the peripheral region, the second dielectric layer therebelow and the fourth dielectric layer on the top surface of the second gate structure with the mask layer as an etching mask, so as to form a spacer on sidewalls of the second gate structure and form a gate dielectric layer between the second gate structure and the substrate; and removing the mask layer.

7. The method of claim 1, further comprising forming a fifth dielectric layer to cover the substrate in the peripheral region and the second gate structure after forming the fourth dielectric layer and before forming second spacers.

8. The method of claim 7, wherein forming the fifth dielectric layer comprises:
   forming a dielectric material layer on the substrate, wherein the dielectric material layer covers the fourth dielectric layer in the memory region and fills in spaces between the plurality of first gate structures and is conformally formed on the substrate in the peripheral region;
   forming a mask layer on the substrate in the peripheral region; and
   performing an isotropic etching process to remove the dielectric material layer in the memory region.

9. The method of claim 1, wherein forming the third dielectric layer comprises: forming an oxide layer in-situ on the substrate.

10. A method for manufacturing a semiconductor structure, comprising:
    providing a substrate having a first dielectric layer thereon;
    forming a plurality of gate structures on the first dielectric layer, wherein the first dielectric layer is between the substrate and the plurality of gate structures;
    forming a second dielectric layer on the substrate, wherein the second dielectric layer covers the substrate, the first dielectric layer and the plurality of gate structures;
    removing portions of the first dielectric layer and simultaneously removing portions of the second dielectric layer on the substrate on both sides of the plurality of gate structures, so as to form first spacers on the sidewalls of the gate structures, form dielectric structures and expose the substrate on the both sides of the plurality of gate structures;
    removing the first spacers on the sidewalls of the gate structures, and simultaneously removing a portion of the dielectric structures to form first dielectric structures, wherein bottom widths of the first dielectric structures are less than bottom widths of the dielectric structures;
    forming a third dielectric layer to cover the substrate, the first dielectric structures and the plurality of gate structures; and
    removing a portion of the third dielectric layer on the substrate to form second spacers on the sidewalls of the gate structures and the sidewalls of the first dielectric structures.

11. The method of claim 10, wherein the first dielectric layer and the second dielectric layer respectively comprise an oxide layer.

12. The method of claim 10, wherein the third dielectric layer comprises a nitride layer.

13. The method of claim 10, wherein removing the portions of the first dielectric layer and simultaneously removing the portions of the second dielectric layer on the substrate comprises performing an anisotropic etching process.

14. The method of claim 10, wherein a method of removing the first spacers, and simultaneously removing the portion of the dielectric structures to form the first dielectric structures comprises performing an isotropic etching process, wherein top widths of the first dielectric structures are less than bottom widths of the first dielectric structures, and the bottom widths of the first dielectric structures are greater than top widths of the gate structures.

15. The method of claim 10, wherein forming the second dielectric layer comprises: forming an oxide layer in-situ on the substrate.

16. The method of claim 14, wherein bottom surfaces of the second spacers are coplanar with bottom surfaces of the first dielectric structures.

* * * * *